United States Patent [19]

Yoo

[11] Patent Number: 5,699,290
[45] Date of Patent: Dec. 16, 1997

[54] FERROELECTRIC READ AND WRITE MEMORY AND DRIVING METHOD THEREOF

[75] Inventor: In-kyeong Yoo, Suwon, Rep. of Korea

[73] Assignee: Samsung Electronics Co. Ltd., Suwon, Rep. of Korea

[21] Appl. No.: 659,885

[22] Filed: Jun. 7, 1996

[30] Foreign Application Priority Data

Jun. 7, 1995 [KR] Rep. of Korea ............ 95-14929

[51] Int. Cl.$^6$ ............................................. G11C 11/50
[52] U.S. Cl. ............................................. 365/145
[58] Field of Search ................................ 365/145

[56] References Cited

U.S. PATENT DOCUMENTS 5,559,733  9/1996  McMillan et al. ............ 365/145

FOREIGN PATENT DOCUMENTS 4312174  11/1992  Japan ............ 365/145

*Primary Examiner*—David C. Nelms
*Assistant Examiner*—Hoai Ho
*Attorney, Agent, or Firm*—Rothwell, Figg, Ernst & Kurz

[57] ABSTRACT

A ferroelectric read and write memory of a nondestructive write and read (NDWR) method in which charges of a gate insulating layer induced by a ferroelectric capacitor are discharged via a separate path, includes a source and a drain provided in both side of a well; a gate insulating layer provided on the well; a gate electrode provided on the gate insulating layer; a ferroelectric layer provided on the gate electrode, to which corresponding charges are induced in the gate electrode depending on its polar states; an upper electrode provided on the ferroelectric layer; and a charge discharging means electrically connected to the gate electrode for discharging charges induced in the gate insulating layer. In a driving method thereof, charges of the gate insulating layer induced by the ferroelectric layer are directly discharged via the gate electrode to make a logic "low" state by blocking the current flow between the source and insulating layer through the well during a binary logic information write operation. Therefore, if the information is written in a non-inversion state of the polarization, a fatigue of the ferroelectric layer can be prevented. Also, as described above, since the remained polarization still exists during the repeated information write operations, the information can be written at a low voltage.

3 Claims, 3 Drawing Sheets

FERROELECTRIC READ AND WRITE MEMORY AND DRIVING METHOD THEREOF

BACKGROUND OF THE INVENTION

The present invention relates to a ferroelectric read and write memory, and more particularly, to a ferroelectric read and write memory of a nondestructive write and read (NDWR) method in which charges of a gate insulating layer induced by a ferroelectric capacitor are discharged via a separate path.

A general ferroelectric capacitor alternates between a positive polarization and a negative polarization and stores information. A polar state determining method is largely divided into a method of detecting a signal generated from the ferroelectric capacitor by applying a predetermined signal thereto and a nondestructive reading operation (NDRO) method in which the polarizing inversion occurs only during a write operation but does not occur during a read operation. The capacitor adopting the NDRO method has a quite different structure from that of a general capacitor.

FIG. 1 shows the unit structure of a ferroelectric memory adopting the ferroelectric capacitor of the NDRO method, and FIGS. 2 and 3 show information read operations depending on the polar states of the ferroelectric capacitor.

Referring to FIG. 1, a transistor provided on a grounded substrate 1 includes a drain 2 and a source 3 formed in opposite sides of a well 1a, a gate insulating layer 4 and gate electrode 5, sequentially deposited on the well. Also, a capacitor provided on the gate electrode 5 includes a ferroelectric layer 6 deposited on the gate electrode 5 and a upper electrode 7 formed thereon. The gate electrode 5 serves as a lower electrode of the capacitor. In other words, the transistor and capacitor share the gate electrode 5.

The ferroelectric read and write memory of the NDRO method has a capacitor connected to a gate, in contrast with the conventional ferroelectric read and write memory in which the capacitor is connected to the source of the transistor. In operating such a ferroelectric read and write memory, if a word voltage is applied between the upper electrode 7 and ground for recording information, charges are induced in the gate insulating layer 4.

FIG. 2 shows an "on" or "high" state of a p-well in which current flows between the source 3 and drain 2, and FIG. 3 shows an "off" or "low" state.

In FIG. 2, the transistor is an npn type with upper and lower portions of the ferroelectric structure of the capacitor polarized into a positive electrode and a negative electrode, respectively. Accordingly, negative charges are induced in the lower portion of the gate insulating layer 4. Therefore, a negative channel is formed in the p-well 1a. As a result, current flows between the source 3 and drain 2.

In contrast to FIG. 2, in FIG. 3, the upper and lower portions of the ferroelectric structure of the capacitor are polarized into a negative electrode and a positive electrode, respectively. Accordingly, positive charges are induced in the lower portion of the gate insulating layer 4. Therefore, a positive channel is formed in the p-well 1a. As a result, current does not flow between the negative source 3 and drain 2.

As described above, a negative or positive channel is formed in the well 1a between the drain 2 and source 3 depending on the sign of charges in the gate insulating layer 4. Thus, when reading the information, in such a state where a gate voltage is not applied, an "on" state where current flows between the drain 2 and source 3 or an "off" state where current does not flow therebetween is detected depending on the channel state (negative or positive), thereby reading the polar state of the ferroelectric layer, i.e., the information of a recorded binary logic state.

This method allows a nondestructive read operation (NDRO) during which the polarizing inversion does not occur in the ferroelectric layer of the capacitor when reading the information, which is different from that of the conventional ferroelectric read and write memory of the destructive read operation method in which the polar inversion occurs. However, since charges must be induced in the gate insulating layer by writing the information in the capacitor, the ferroelectric read and write memory of the NDRO method requires a large word voltage. Also, in contrast with the information read operation, since the ferroelectric structure must be polarized into a negative electrode and a positive electrode during an information write operation, as shown in FIGS. 2 and 3, fatigue due to the polar inversion may occur. Since this fatigue shortens the life span of the capacitor, attempts to avoid fatigue due to the polar inversion of the ferroelectric structure should be made. To reduce the fatigue, an electrode made of a special material may be used. However, this method may inhibit polarizing characteristic of the ferroelectric layer.

SUMMARY OF THE INVENTION

It is an object of the present invention to provide an improved ferroelectric read and write memory and driving method thereof, which prevents the polar inversion of a ferroelectric layer during information read and write operations.

To accomplish the above objects, there is provided a ferroelectric read and write memory comprising: a source and drain provided on opposite sides of a well; a gate insulating layer provided on the well; a gate electrode provided on the gate insulating layer; a ferroelectric layer provided on the gate electrode, by which corresponding charges are induced in the gate electrode depending on its polar state; an upper electrode provided on the ferroelectric layer; and a charge discharging means electrically connected to the gate electrode for discharging charges induced in the gate insulating layer.

Also, to accomplish the above object, there is provided a ferroelectric read and write memory driving method for writing information on the ferroelectric read and write memory having a source and a drain provided on opposite sides of a well, a gate insulating layer provided on the well, a gate electrode provided on the gate insulating layer, a ferroelectric layer provided on the gate electrode, by which corresponding charges are induced in the gate electrode depending on its polar state, an upper electrode provided on the ferroelectric layer, and a charge discharging means electrically connected to the gate electrode for discharging charges induced in the gate insulating layer, the method comprising the step of: directly discharging charges of the gate insulating layer induced by the ferroelectric layer via the gate electrode to make a logic "low" state by blocking the current flow between the source and gate insulating layer through the well during a binary logic information write operation.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
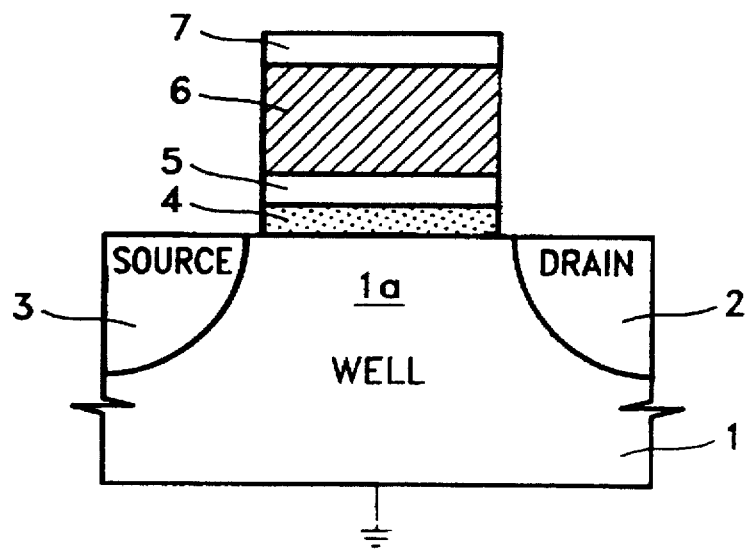
FIG. 1 is a schematic diagram of a conventional ferroelectric read and write memory of a nondestructive reading operation (NDRO) method.
Figure 2:
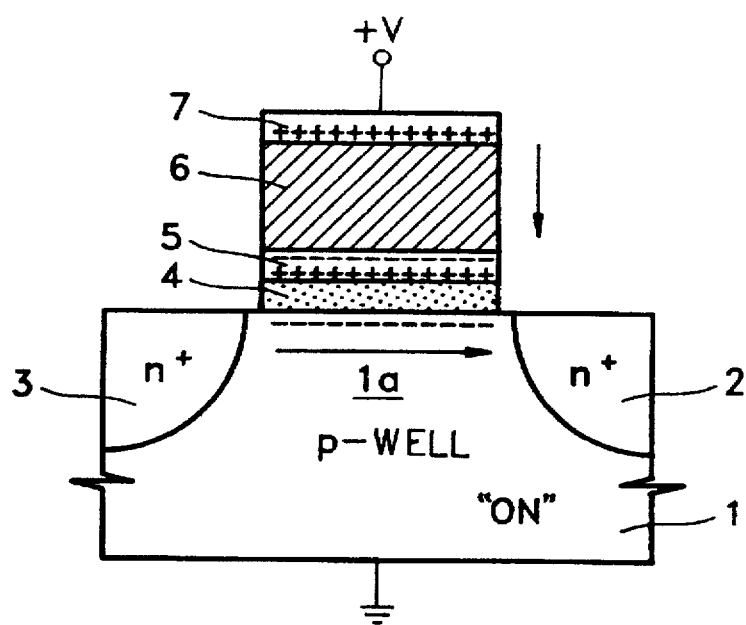
FIG. 2 shows a logic "high" state of the ferroelectric read and write memory of a nondestructive reading operation (NDRO) method; shown in FIG. 1.
Figure 3:
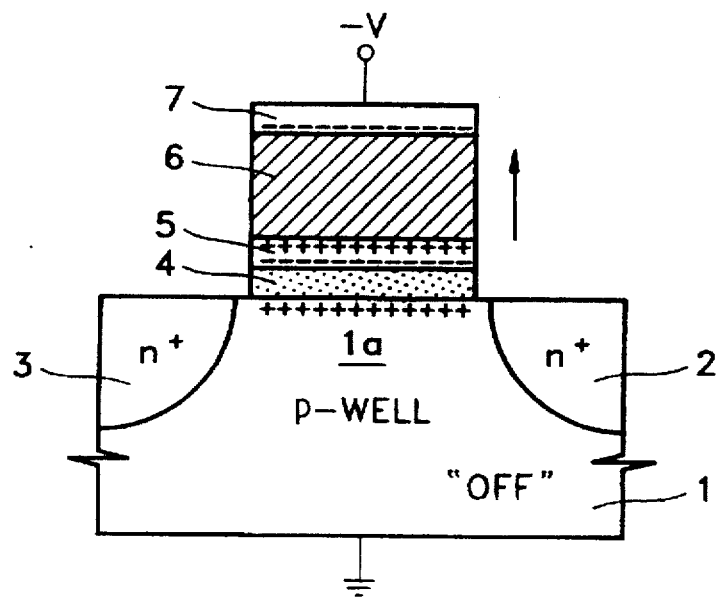
FIG. 3 shows a logic "low" state of the ferroelectric read and write memory of a nondestructive reading operation (NDRO) method; shown in FIG. 1.
Figure 4:
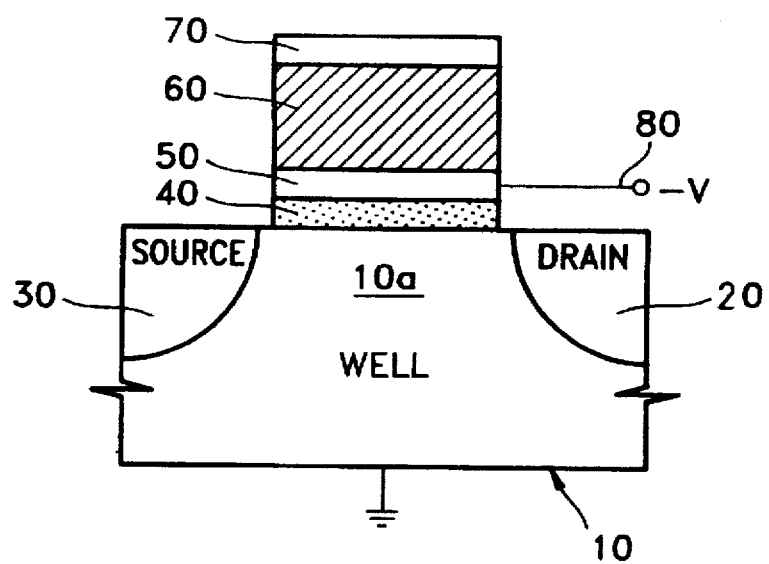
FIG. 4 is a schematic diagram of a ferroelectric memory according to the present invention.

Referring to FIG. 4, a transistor provided on a grounded substrate 10 includes a drain 20 and a source 30 formed on both sides of a well 10a, a gate insulating layer 40 and gate electrode 50, sequentially deposited on the well 10a. Also, a capacitor provided on the gate electrode 50 includes a ferroelectric layer 60 deposited on the gate electrode 50 and an upper electrode 70 formed thereon. At this time, the gate electrode 50 serves as the lower electrode of the capacitor. Therefore, like in the conventional ferroelectric read and write memory, the transistor and capacitor share the gate electrode 50.

In such a structure, the gate electrode 50 does not allow charging and discharging through the same path. In other words, the gate electrode 50 is electrically connected to an external element via a separate electric line 80, in contrast with the gate electrode 5 of the conventional ferroelectric read and write memory. The gate electrode 50 having the separate electric line 80 functions as a means for directly discharging charges from the gate insulating layer 40 induced by the ferroelectric layer 60.

As described above, in the present invention, the transistor is an npn-type or a pnp-type and the polarity of the voltage applied thereto will be changed according to the transistor type. The ferroelectric layer 60 preferably adopts a material having a large coercive field to maximize the unidirectional polarization. Also, it is preferable that the dielectric material has a dielectric ratio greater than that of $SiO_2$ in order to reduce the voltage of charges induced in the gate insulating layer 40.

Hereinbelow, the embodiment of the ferroelectric read and write memory driving method for logic information write and read operations will be described, the logic information being divided into "low" and "high".

Since the logic information read operation is the same as that of the conventional NDRO method, it will not be further explained herein. Instead, the information write operation will now be described.

Figure 5:
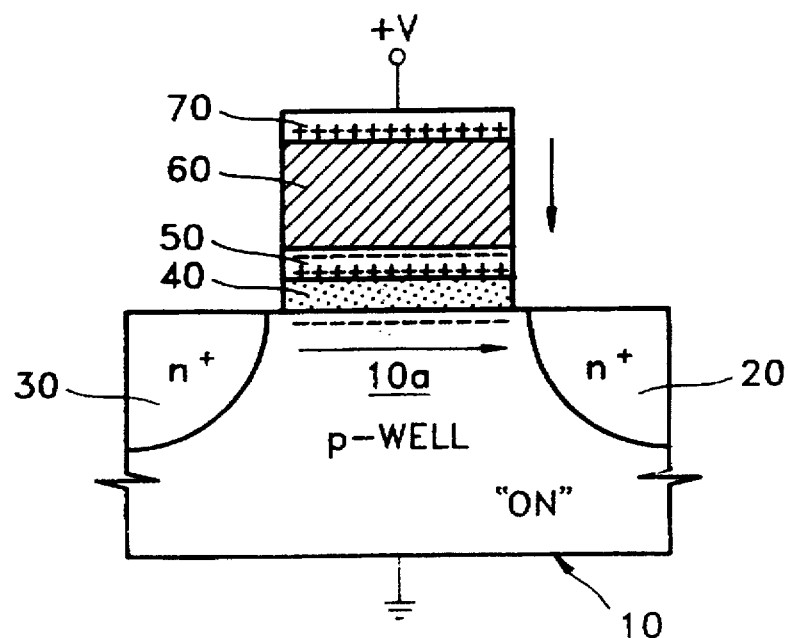
FIG. 5 shows a state where information is written in a logic "high" state of the ferroelectric read and write memory according to the present invention shown in FIG. 4.

FIG. 5 shows a state where information pertaining to a logic "high" is read by the gate insulating layer, into which charges are induced by the ferroelectric layer of a capacitor.

Figure 6:
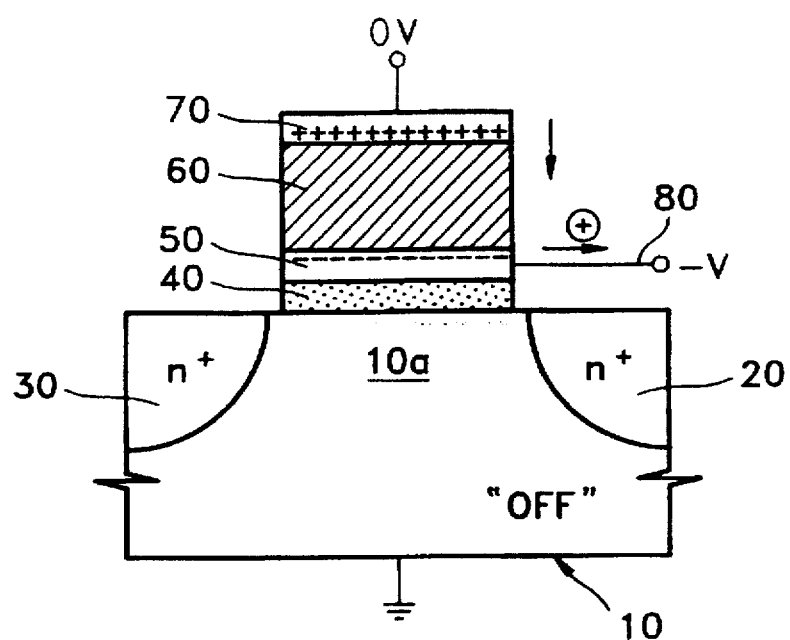
FIG. 6 shows a state where information is written in a logic "low" state of the ferroelectric read and write memory according to the present invention shown in FIG. 4.

FIG. 6 shows a state where information pertaining to a logic "low" is read by the gate insulating layer into which charges are not induced.

To make a logic "high" state, as shown in FIG. 5, a word voltage is applied between the upper electrode 70 and ground to write information in the capacitor so that charges are induced in the gate insulating layer 40 formed in the electric path. Here, negative charges are induced to the p-well by a domain of the ferroelectric layer and positive and negative charges are distributed above and below the gate electrode. However, the gate electrode above and below which positive and negative charges are distributed comes to be electrically neutral. By doing so, a channel is formed in the well by the gate insulating layer 40 into which charges are induced so that the current flows between the source 30 and drain 20.

To make a logic "low" state, a negative voltage is applied to the gate electrode 50, and no voltage is applied to the upper electrode 70, that is, a ground state is maintained. Then, while only the charges induced in the gate insulating layer 40 are rapidly discharged via the electric path externally connected by the gate electrode 50, negative charges of the p-well disappear. As a result, the ferroelectric layer 60 is refreshed. Since the polarization of the ferroelectric layer 60 retains its previous state when no voltage is applied, charges are induced in the gate insulating layer 40 at a low voltage, that is, the logic "high" state is produced.

The aforementioned information write state will be described. The logic "low" or "high" information can be written in a state where the polar inversion of the ferroelectric layer does not occur. As described above, if the information is written in a non-inversion state of the polarization, fatigue of the ferroelectric layer can be prevented. Also, as described above, since the polarization due to the previous voltage still exists during the repeated information write operations, the information can be written at a low voltage. Also, since the ferroelectric layer is polarized unidirectionally, there is no fatigue, lengthening the life span of the capacitor.

What is claimed is:

1. A ferroelectric read and write memory comprising:
    a source and a drain provided on opposite sides of a channel;
    a gate insulating layer provided on said channel;
    a gate electrode provided on said gate insulating layer;
    a ferroelectric layer provided on said gate electrode, to which corresponding charges are induced in said gate electrode depending on its polarization states;
    an upper electrode provided on said ferroelectric layer; and
    a charge discharging means electrically connected to said gate electrode for discharging charges induced in said gate insulating layer without changing the direction of the ferroelectric polarization state.

2. A ferroelectric read and write memory as claimed in claim 1, wherein said gate insulating layer is made of a dielectric material of non-oxidized silicon.

3. A ferroelectric read and write memory driving method for writing and reading information to the ferroelectric read and write memory having a source and a drain provided on opposite sides of a channel which is electrically connected to ground, a gate insulating layer provided on said channel, a gate electrode provided on said gate insulating layer, a ferroelectric layer provided on said gate electrode, by which corresponding charges are induced in said gate electrode depending on its polarization state, an upper electrode provided on said ferroelectric layer, and a charge discharging means electrically connected to said gate electrode for discharging charges induced in said gate insulating layer, said method comprising the step of:

applying a voltage to the upper electrode to make a logic 'high' state in a binary logic information write operation so that the polarization state occurring in said ferroelectric layer does not change;

directly discharging charges from said gate electrode to make a logic 'low' state in a binary logic information write operation by applying a voltage to said charge discharge means, wherein the direction of polarization state in said ferroelectric layer does not change from that during a logic 'high' state; and detecting current flow between said source and drain through said channel as reading information.

* * * * *